United States Patent
Chemisky et al.

(10) Patent No.: US 7,358,644 B2
(45) Date of Patent: Apr. 15, 2008

(54) METHOD FOR CONTROLLING AN ACTUATOR AND CONTROL DEVICE BELONGING THERETO

(75) Inventors: Eric Chemisky, Lauterbourg (FR); Walter Schrod, Regensburg (DE)

(73) Assignee: Siemens Aktiengesellschaft, Munich (DE)

(*) Notice: Subject to any disclaimer, the term of this patent is extended or adjusted under 35 U.S.C. 154(b) by 568 days.

(21) Appl. No.: 10/962,795

(22) Filed: Oct. 12, 2004

(65) Prior Publication Data

US 2005/0057118 A1   Mar. 17, 2005

Related U.S. Application Data

(63) Continuation of application No. PCT/DE03/01613, filed on May 19, 2003.

(30) Foreign Application Priority Data

May 27, 2002 (DE) .................. 102 23 553

(51) Int. Cl.
*H01L 41/08* (2006.01)
(52) U.S. Cl. ................................. 310/316.01
(58) Field of Classification Search .......... 310/316.03; 123/32 EA, 490, 498

See application file for complete search history.

(56) References Cited

U.S. PATENT DOCUMENTS

| | | | | |
|---|---|---|---|---|
| 3,589,345 A | * | 6/1971 | Benson | 123/478 |
| 3,612,011 A | * | 10/1971 | Monpetit | 123/490 |
| 3,710,763 A | * | 1/1973 | Bassot et al. | 123/490 |
| 3,763,833 A | * | 10/1973 | Rachel | 123/490 |
| 3,822,678 A | * | 7/1974 | Bassot et al. | 123/490 |
| RE31,658 E | * | 9/1984 | Rachel | 123/488 |
| 4,608,506 A | | 8/1986 | Tanuma | 310/315 |
| 4,632,311 A | | 12/1986 | Nakane et al. | 239/101 |
| 5,387,832 A | | 2/1995 | Tanaka et al. | 310/249 |
| 5,387,834 A | | 2/1995 | Suzuki | 310/317 |
| 5,479,062 A | | 12/1995 | Yoshino | 310/316 |
| 5,517,073 A | | 5/1996 | Ohkuma | 310/315 |
| 5,517,845 A | | 5/1996 | Yamashita et al. | 73/1 |
| 5,566,659 A | * | 10/1996 | Franzke et al. | 123/490 |
| 5,659,270 A | | 8/1997 | Millen et al. | 331/69 |
| 5,987,992 A | | 11/1999 | Watanabe et al. | 73/632 |
| 6,198,199 B1 | | 3/2001 | Hoffmann et al. | 310/316.03 |

(Continued)

FOREIGN PATENT DOCUMENTS

DE    3538964 A1    5/1987

(Continued)

OTHER PUBLICATIONS

International PCT Search Report for application No. PCT/DE03/01613, 7 pages, Mailing Date Sep. 22, 2003.

(Continued)

*Primary Examiner*—Mark Budd
(74) *Attorney, Agent, or Firm*—Baker Botts L.L.P.

(57) ABSTRACT

A method for the electric control of an actuator, especially a piezoelectric actuator of an injection system comprises the following steps: charging the actuator; waiting during a specific period of time (D1, D2) and discharging the actuator after the expiration of the period of time (D1, D2). The period of time (D1, D2) is variably determined in order to compensate the quantization steps.

19 Claims, 4 Drawing Sheets

U.S. PATENT DOCUMENTS

| | | | |
|---|---|---|---|
| 6,441,535 B2 | 8/2002 | Freudenberg et al. | 310/316.03 |
| 6,661,155 B2 | 12/2003 | Schrod | 310/316.01 |
| 7,103,492 B2 * | 9/2006 | Chen | 702/107 |
| 2001/0032058 A1 * | 10/2001 | Rueger et al. | 702/107 |
| 2001/0035697 A1 * | 11/2001 | Rueger et al. | 310/316.03 |
| 2002/0046731 A1 | 4/2002 | Rueger et al. | 123/299 |
| 2004/0195936 A1 | 10/2004 | Chemisky et al. | 310/317 |
| 2005/0057118 A1 | 3/2005 | Chemisky et al. | 310/314 |

FOREIGN PATENT DOCUMENTS

| | | |
|---|---|---|
| DE | 19632872 A1 | 2/1998 |
| DE | 19652801 C1 | 4/1998 |
| DE | 19714607 A1 | 10/1998 |
| DE | 19808994 A1 | 10/1998 |
| DE | 198 54 789 A1 | 8/1999 |
| DE | 19805184 A1 | 8/1999 |
| DE | 198 45 042 C2 | 8/2000 |
| DE | 199 0388 A1 | 9/2000 |
| DE | 19931233 A1 | 1/2001 |
| DE | 199 44 733 A1 | 3/2001 |
| DE | 100 38 995 A1 | 4/2001 |
| DE | 199 44 734 A1 | 4/2001 |
| DE | 199 31 235 C2 | 8/2001 |
| EP | 1172541 A1 | 7/2000 |
| EP | 1 138 903 A1 | 10/2001 |
| EP | 1 138 915 A1 | 10/2001 |
| EP | 1 139 446 A1 | 10/2001 |
| JP | 02286852 | 11/1990 |
| JP | 05284600 | 10/1993 |
| WO | 9827600 | 6/1998 |
| WO | 01/77510 A1 | 10/2001 |
| WO | 02/078098 A2 | 10/2002 |
| WO | 03027468 A1 | 4/2003 |
| WO | 03100235 | 12/2003 |

OTHER PUBLICATIONS

International PCT Search Report for application No. PCT/DE02/01029, 7 pages, Mailing Date Mar. 3, 2003.

* cited by examiner

METHOD FOR CONTROLLING AN ACTUATOR AND CONTROL DEVICE BELONGING THERETO

CROSS REFERENCE TO RELATED APPLICATION

This application is a continuation of copending International Application No. PCT/DE03/01613 filed May 19, 2003 which designates the United States, and claims priority to German application no. 102 23 553.8 filed May 27, 2002.

TECHNICAL FIELD OF THE INVENTION

The invention relates to a method for the electrical control of an actuator, especially a piezoelectric actuator of an injection system for an internal combustion engine, and a corresponding control device.

DESCRIPTION OF THE RELATED ART

Piezoelectric actuators are increasingly being used in modern injection systems for internal combustion engines, to inject the fuel into the combustion chambers. Piezoelectric actuators of this type require voltages in the 120-400 volt range so that timed switch mode power supplies, for example, can be used for the electrical control of the piezoelectric actuators, whereby the switch mode power supplies generate the voltage necessary for the actuators from the vehicle power supply system voltage of—typically—12, 24 or 42 volts.

DE 199 44 733 A1 discloses such a switch mode power supply, which has a transformer for voltage conversion and which charges the actuator in a charge phase and then discharges it again in a discharge phase, in order to generate the required corrective motion of the actuator. After the charge phase, the switch mode power supply waits for a constant delay period until starting the discharge process to ensure that the transformer is completely empty at the start of the discharge process.

The disadvantage of switch mode power supplies of this type, however, is the fact that the output power and thus the injection quantity has large quantization steps, which is caused—among other things—by the time patterning associated with the timing. The quantization in the actuator control thus results in quantization of the injected fuel quantity, which is contrary to the objective of achieving maximum precision in the control of the internal combustion engine and is associated with undesirable exhaust emissions.

SUMMARY OF THE INVENTION

The object of the invention is therefore to provide a method for the electrical control of an actuator and a corresponding control device, in which quantization steps are to be avoided as far as possible.

This object can be achieved by a method for the electrical control of an actuator, comprising the steps of charging of the actuator, waiting during a specific delay period, and discharging of the actuator after the expiration of the delay period, wherein the delay period is variably determined according to the position in time of a discharge signal.

The actuator can be charged by a sequence of charge pulses, whereby the delay period is defined according to the time span between the discharge signal and the start of the preceding charge pulse. The delay period may commence with the start of the preceding charge pulse and/or the start of a charge signal. The delay period may have a linear dependency on the time span between the discharge signal and the start of the preceding charge pulse. The delay period may have a predefined minimum value. The discharge signal can be a falling edge of a control signal. The actuator can be charged when a charge signal occurs. The charge signal can be a rising edge of a control signal.

The object can also be achieved by a control device for an actuator, comprising: a signal input for picking up a discharge signal, a signal output for delivering a control signal for discharging the actuator, and a delay element for delaying the control signal by a specific delay period, wherein the delay element has a variable delay period and is dependent on the position in time of the discharge signal.

A pulse generator can be provided for generating charge pulses. A first counter can be provided for determining the time interval between the discharge signal and the start of the preceding charge pulse, the first counter being connected at the output end to the delay element in order to define the delay period depending on the time interval between the discharge signal and the start of the preceding charge pulse. The delay element can be connected at the input end to the signal input, in order to start the delay period when a charge signal occurs. The delay element may have a second counter, which is connected at the input end to a pulse generator and to the signal input.

The invention incorporates the general technical principle of variably defining the delay period between the charge phase and the discharge phase, in order to equalize the quantization steps caused by the time patterning.

For example, if the discharge signal appears shortly after the start of a time pattern, the reference point for the start of the discharge phase is displaced to the end of this time pattern, which—in a conventional control system—would result in a large quantization step. In this case, the invention advantageously provides for a relatively short delay period in order to equalize the quantization step which is associated with the displacement in time of the reference point for the discharge phase. In this case, it is preferable if the delay period is relatively short compared to the time pattern.

However, if the discharge signal occurs shortly before the end of a time pattern, the displacement of the reference point for the start of the discharge phase results only in a very minor quantization step. In this case the invention preferably provides for a relatively long delay period until the start of the discharge phase, to ensure that the quantization steps remain as small as possible irrespective of the position in time of the discharge signal. In this case it is preferable for the delay period to be relatively long compared to the time pattern, possibly equaling the duration of two time patterns, for example.

In the preferred embodiment of the invention, therefore, the delay period is variably determined depending on the position in time of the discharge signal.

Preferably, the timing interval is calculated between the discharge signal and the start of the preceding charge pulse, and the delay period is determined depending on this interval. It is assumed here that the duration of the charge pulse is determined by the time patterning, so that the start of each charge pulse coincides with the start of a time pattern.

This delay period preferably has a linear dependency on the time span between the discharge signal and the start of the preceding charge pulse, such that the delay period preferably increases linearly with the time span between the discharge signal and the start of the preceding charge pulse.

This delay period preferably has a minimum value irrespective of the position in time of the discharge signal, the purpose of the minimum value being to ensure that the transformer in the switch mode power supply is drained before the start of the discharge phase. The minimum value of the delay period might be—for example—between one and ten time patterns, with any value within this range being possible.

In addition, the delay period may also have another functional dependency on the time span between the discharge signal and the preceding charge pulse. For example, the functional dependency may be proportional, progressive or regressive, in order to optimize the compensation of the quantization steps necessitated by the time patterning.

Each delay period preferably begins with the start of the last charge pulse, but may also begin with the discharge signal.

In the preferred embodiment of the invention the discharge signal is formed by a falling edge of a control signal, whilst the rising edge of the control signal forms a charge signal.

The invention also incorporates a control device for carrying out the inventive method described above.

The control device according to the invention has a signal input at which the discharge signal is picked up.

Furthermore, the control device according to the invention has a signal output for delivering a control signal which starts the discharge phase, with the current being completed—for example—by a discharge transistor of the switch mode power supply.

The output of the control signal is delayed for a specific period of time by a delay element, whereby the delay period is variable to enable the effects of quantization steps to be compensated by adjusting the delay period.

The delay period is preferably dependent on the time interval between the discharge signal and the start of the preceding charge pulse. A counter is preferably provided to calculate this time interval, the counter being synchronized with the start of a charge pulse and delivering a pulse count at the output end. This pulse count reflects the time span since the start of the last charge pulse. When the discharge signal appears the delay element then adopts this pulse count as the delay period.

The delay element itself preferably has an additional counter that counts the pulses of a clock signal and starts the discharge process when a specified lower or upper limit is reached.

BRIEF DESCRIPTION OF THE DRAWINGS

Other advantageous developments of the invention are contained in the subclaims or are explained below together with the description of the preferred exemplary embodiment of the invention on the basis of the diagrams. In these.

DETAILED DESCRIPTION OF THE PREFERRED EMBODIMENTS

Figure 1:
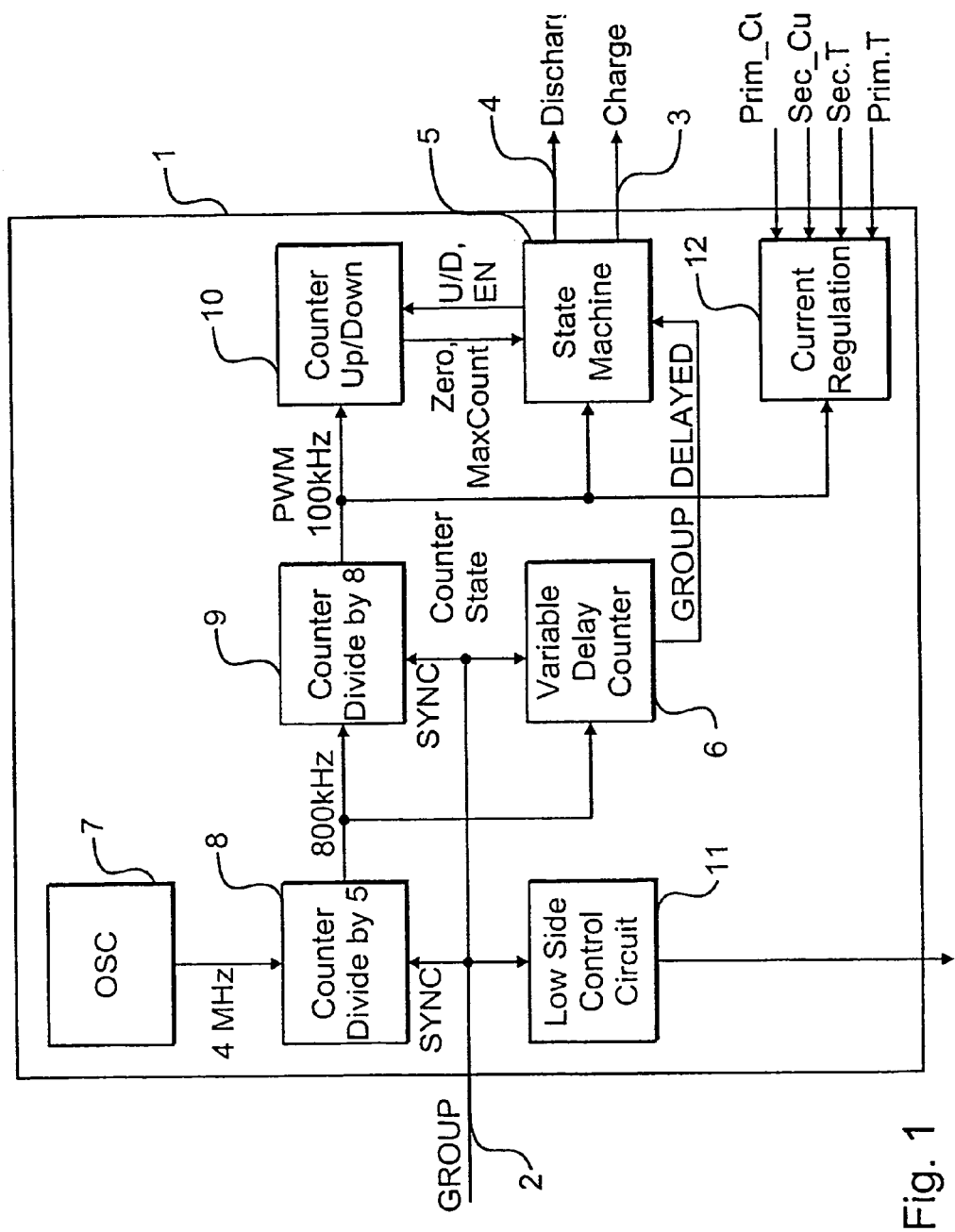
FIG. 1 is a circuit diagram of the control device according to the invention.

The circuit diagram in FIG. 1 shows a control device 1 for controlling the charge and discharge process of a piezoelectric actuator of an injection system for an internal combustion engine, in order to set the desired travel for the actuator and to define the time and duration of the injection.

The time and duration of the injection are defined by a control signal GROUP, which is present on a signal input 2 of the control device 1 and is provided by electronic engine control system. The charge process starts with a rising edge of the control signal GROUP, while a falling edge of the control signal GROUP initiates the discharge process, as shown by the pulse diagram in FIG. 3 and described in greater detail below.

The electrical charging of the actuator is effected in the conventional way by a switching device, which is controlled by a signal output 3 of the control unit 1. The switching device is not illustrated for the sake of simplicity. A binary control signal CHARGE appears at the signal output 3. If this binary control signal CHARGE is at a high level it causes the actuator to be charged, while a low level of the control signal CHARGE terminates the charge process.

To discharge the actuator, a further switching device is controlled by a further signal output 4 with a binary control signal DISCHARGE, whereby a high level of the control signal DISCHARGE starts the discharge process while a low level of the control signal DISCHARGE terminates the discharge process.

The charging and discharging of the actuator by the two switching devices is effected via a transformer circuit, which is described in detail—for example—in DE 199 44 733 A1, so that the contents thereof are applicable in full to the present description.

The two control signals CHARGE and DISCHARGE are generated in this circuit by a state machine 5, which—after the end of the charge process—waits for a specific period of time before starting the discharge process. The advantage of this delay is that the transformer being used to control the actuator is completely drained before the start of the discharge process.

In order to delay the delivery of the control signal DISCHARGE, the control device 1 has a delay element 6 which is connected at the output end to the state machine 5 and which controls the state machine with a binary control signal GROUP_DELAYED. When the control signal GROUP_DELAYED is at a high level the state machine 5 delivers the control signal DISCHARGE at a high level to the signal output 4, causing the discharge process to be started immediately.

Furthermore, the control device 1 has a pulse generator 7 which generates a clock signal with a frequency of 4 MHz.

This clock signal is fed to a frequency divider 8, which divides the frequency of the clock signal by 5 and generates a pulse sequence with a frequency of 800 kHz at the output end, the pulse sequence being used as the reference signal for the control device 1.

At the input end, the frequency divider 8 has a synchronization input SYNC to which the control signal GROUP is fed. The pulse sequence delivered at the output end by the frequency divider 8 is therefore synchronized with a rising edge of the control signal GROUP. This synchronization reduces the jitter between the rising edge of the control signal GROUP and the actual start of the charge process to less than 250 ns. This is particularly advantageous in direct injection engines for the purpose of reducing exhaust emissions.

At the output end, the frequency divider 8 is connected to the delay element 6 and to an additional frequency divider 9, the frequency divider 9 having the task of variably determining the delay time for the delay element 6.

The frequency divider 9 generates a pulse sequence PWM with a frequency of 100 kHz at the output end. This pulse sequence is shown at the top of the pulse diagram in FIG. 3 and at the bottom of the pulse diagram in FIG. 4.

The pulse sequence PWM generated by the frequency divider 9 is synchronized with the control signal GROUP, such that a rising edge of the control signal GROUP coincides with a rising edge of the pulse sequence PWM. The frequency divider 9 therefore has a synchronization input SYNC, which is connected to the signal input 2 of the control device 1.

At the output end, the frequency divider 9 is connected to the state machine 5, which executes the charge or discharge process when the pulse sequence PWM occurs.

In addition, the frequency divider 9 is also connected to a counter 10, which counts the number of pulses in the pulse sequence PWM during the charge or discharge process.

If the number of charge pulses registered by the counter 10 during charging of the actuator exceeds a specified maximum value MAXCOUNT, the counter 10 delivers an abort signal to the state machine 5, whereupon the state machine aborts the charge process. To this end the state machine 5 brings the control signal CHARGE at the control output 3 to a low level, thus also preventing the actuator from becoming excessively charged. Typical values for the maximum value MAXCOUNT are in the 20 to 30 range, which is equivalent to 60 to 90 mJ of energy stored in the actuator.

In a discharge process, the counter 10 then counts down the number of discharge pulses on the basis of the number determined previously during the charge phase, and likewise delivers an abort signal to the state machine 5 when the count reaches zero, in order to terminate the discharge process. To this end the state machine 5 brings the control signal DISCHARGE at the signal output 4 to a low level, whereupon the discharge process is immediately terminated. This counting down of the discharge pulses ensures that the number of discharge pulses during the discharge process is at least as high as the number of charge pulses during the preceding charge process, so that the actuator is mostly discharged before it shorts out. This is because it is necessary for the actuator to be completely discharged to enable it to be brought to a defined energy level during the subsequent charge process.

The control device also has a further control circuit 11 for controlling a plurality of selection switches, which are not illustrated for the sake of simplicity. The selection switches are each assigned to one of a number of actuators and enable the actuators to be charged or discharged selectively for specific combustion chambers.

Finally, the frequency divider 9 is also connected to a conventional current control unit 12, which controls the primary and secondary current in the aforementioned transformer circuit.

Figure 2:
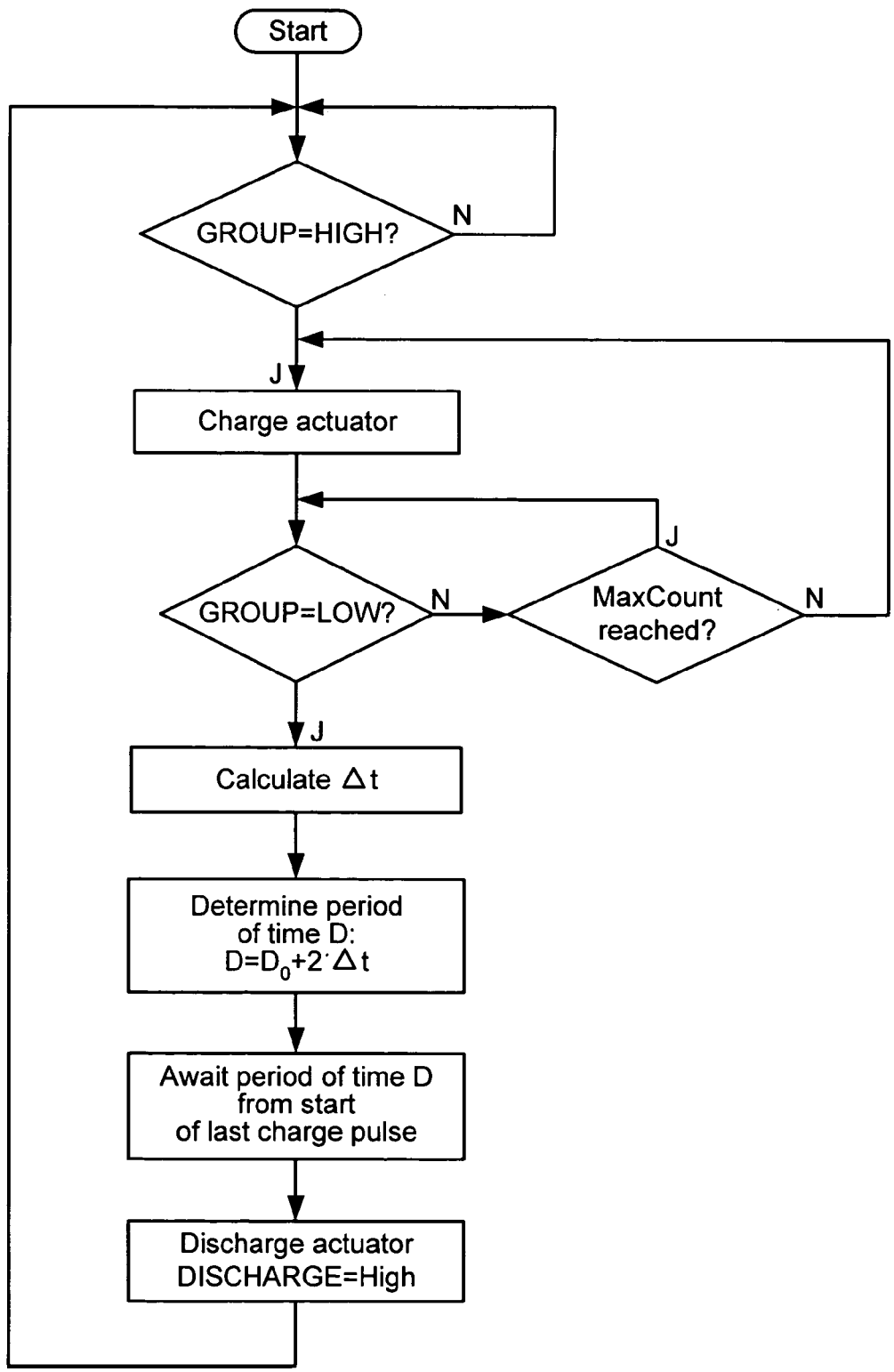
FIG. 2 is a flow chart of the method for controlling the actuator.

The functioning of the control device 1 according to the invention is now described below with reference to the pulse diagrams in FIG. 3 and the flowchart in FIG. 2.

Figure 3:
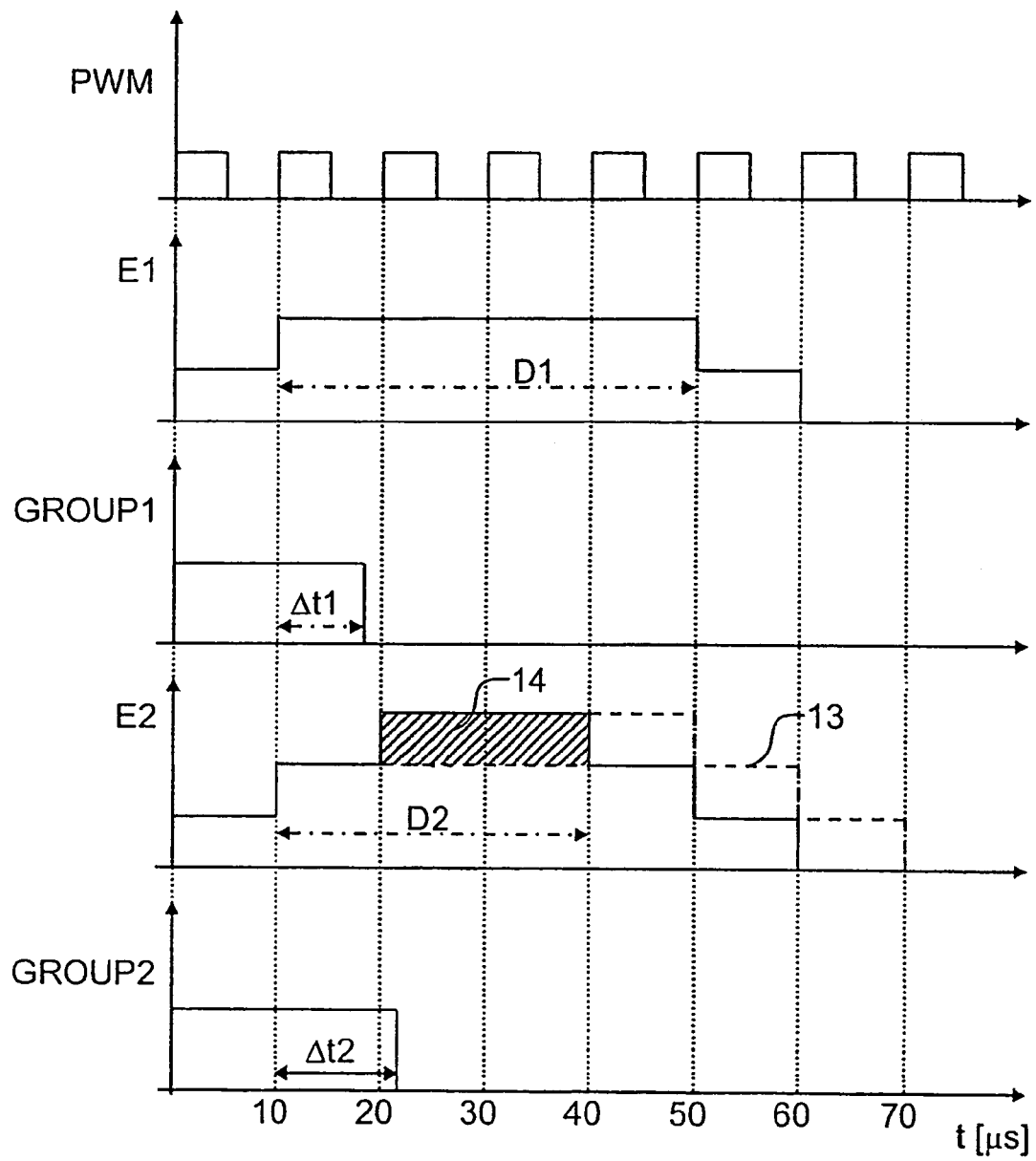
FIG. 3 is a pulse diagram for illustrating the method according to the invention.

FIG. 3 shows a total of five pulse diagrams, the pulse diagram at the top reflecting the time progression of the pulse sequence PWM generated by the frequency divider 9.

The pulse diagrams below this in FIG. 3, however, reflect the time progression of the actuator energy E1 or E2 for slightly varying control signals GROUP1 and GROUP2.

Charging of the actuator is initiated at time t=0 by a rising edge of the control signal GROUP1 or GROUP2. This leads to synchronization of the pulse sequence PWM by the frequency divider 9, so that the state machine 5 brings the control signal CHARGE to a high level, while the control signal DISCHARGE assumes a low level.

During the charge process the frequency divider 9 delivers the number of pulses since the start of the last charge pulse at its output COUNTER_STATE, this figure corresponding to the time span $\Delta t_1$ or $\Delta t_2$ in FIG. 3.

In addition, during the charge process the counter 10 counts the number of pulses and aborts the charge process when the specified maximum value MAX_COUNT is reached, to prevent the actuator from becoming excessively charged.

The discharge process is then initiated with a falling edge of the control signal GROUP1 or GROUP2, the discharge process being delayed to ensure that the transformer in the aforementioned transformer circuit is first completely drained.

For this purpose, the delay element 6 takes over the pulse count COUNTER_STATE from the frequency divider 9 when a falling edge occurs in the control signal GROUP1 or GROUP2, the pulse count having been measured from the start of the last charge pulse of the pulse sequence PWM. The delay element 6 determines from this the corresponding time span $\Delta t_1$ or $\Delta t_2$ and calculates a delay period D1 or D2 according to the following formula:

$$D = D_0 + 2 \cdot \Delta t.$$

Figure 4:
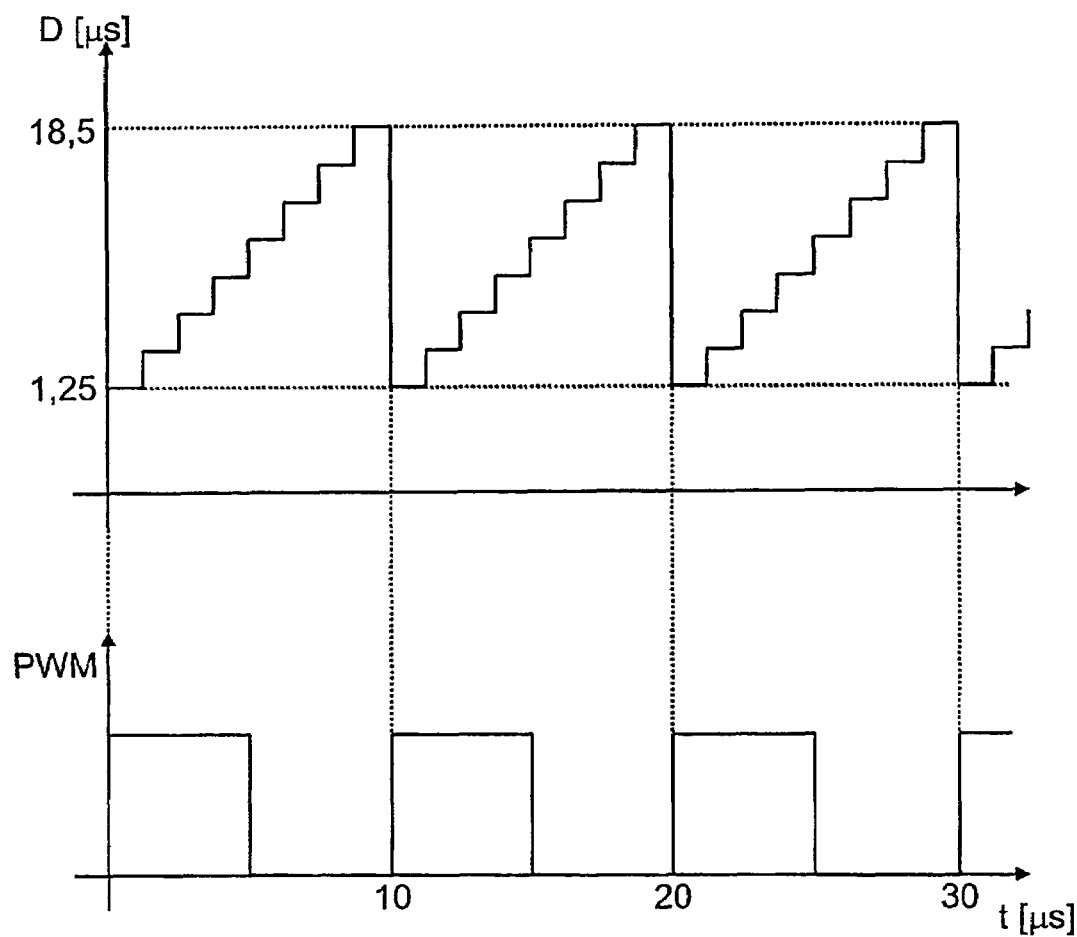
FIG. 4 is a pulse diagram for illustrating the variable determination of the delay period in the method according to the invention.

In the above formula, $D_0 = 1.25$ is is a minimum delay period intended to ensure that the transformer in the aforementioned transformer circuit is completely discharged before the start of the discharge process. The delay period D is thus also dependent on the time span $\Delta t_1$ or $\Delta t_2$ between the falling edge of the control signal GROUP1 or GROUP2 as the discharge signal, and the start of the last charge pulse of the pulse sequence, whereby this dependence has a linear progression as shown at the top of FIG. 4. The staging of the progression of the delay period D in FIG. 4 is due to the fact that the frequency divider 9 is controlled with a frequency of 800 kHz, while the pulse sequence PWM only has a frequency of 100 kHz.

After a falling edge occurs in the control signal GROUP1 or GROUP2, the delay element 6 counts the number of pulses generated by the frequency divider 8 and delivers the control signal GROUP_DELAYED to the state machine 5, if the delay period D has expired since the start of the preceding charge pulse, as shown in FIG. 3. The state machine 5 consequently brings the control signal DISCHARGE to a high level, whereupon the discharge process starts immediately.

Variable determination of the delay period D before the start of the discharge process, in accordance with the invention, has the advantage of reducing the disruptive influence of the time discretization in the timed charging and discharging of the actuator.

Thus in conventional arrangements in which the delay period is constant, even minor displacements in the falling edge of the control signal GROUP as the discharge signal can lead to significant changes in the injection quantity. This is the case if the discharge signal is displaced over a time discretization limit, the limit being illustrated by vertical dotted lines in the pulse diagram in FIG. 3. This is because the discharge is delayed by a complete time discretization unit if the discharge signal is displaced in this way, which would lead to an energy progression 13 shown by a dotted line in FIG. 3.

In contrast, flexible definition of the delay period D in the control device according to the invention in the event of minor displacements of the discharge signal only results in minor changes in the actuator energy, which is shown in FIG. 3 by a hatched area 14.

The invention is not limited to the preferred exemplary embodiment described above. A multitude of variants and modifications is possible, which likewise utilize the object of the invention and therefore also fall within the scope.

We claim:

1. A method for the electrical control of an actuator, comprising the steps of:
   charging of the actuator using a clock signal,
   waiting during a specific delay period, and
   discharging of the actuator after the expiration of the delay period using the clock signal, wherein the delay period is variably adjusted depending on the position in time of a discharge signal to an edge of the clock signal.

2. The method according to claim 1, wherein the delay period is adjusted by adjusting the position in time of the discharge signal to a nearest edge of the clock signal.

3. The method according to claim 2, wherein the delay period commences with the start of the preceding charge pulse and/or the start of a charge signal.

4. The method according to claim 2, wherein the delay period has a linear dependency on the time span between the discharge signal and the start of the preceding charge pulse.

5. The method according to claim 3, wherein the delay period has a linear dependency on the time span between the discharge signal and the start of the preceding charge pulse.

6. The method according to claim 1, wherein the delay period has a predefined minimum value.

7. The method according to claim 1, wherein the discharge signal is a falling edge of a control signal.

8. The method according to claim 1, wherein the actuator is charged when a charge signal occurs.

9. The method according to claim 8, wherein the charge signal is a rising edge of a control signal.

10. A control device for an actuator, comprising:
    a signal input for picking up a discharge signal,
    a signal output for delivering a control signal for discharging the actuator, and
    a delay element for delaying the control signal by a specific delay period, wherein the delay element has a variable delay period and is dependent on the position in time of the discharge signal, wherein a first counter is provided for determining the time interval between the discharge signal and the start of the preceding charge pulse, said first counter being connected at the output end to the delay element in order to define the delay period depending on the time interval between the discharge signal and the start of the preceding charge pulse.

11. The control device according to claim 10, wherein a pulse generator is provided for generating charge pulses.

12. The control device according to claim 10, wherein the delay element is connected at the input end to the signal input, in order to start the delay period when a charge signal occurs.

13. The control device according to claim 10, wherein the delay element has a second counter, which is connected at the input end to a pulse generator and to the signal input.

14. A method for the electrical control of an actuator, comprising the steps of:
    charging of the actuator by a sequence of charge pulses,
    waiting during a specific delay period, and
    discharging of the actuator after the expiration of the delay period, wherein the length of the delay period is defined using the charge pulses and a discharge signal wherein the length of the delay period is adjusted to a closest pulse of the charge pulses.

15. The method according to claim 14, wherein the delay period commences with the start of the preceding charge pulse and/or the start of a charge signal.

16. The method according to claim 14, wherein the delay period has a linear dependency on the time span between the discharge signal and the start of the preceding charge pulse.

17. The method according to claim 15, wherein the delay period has a linear dependency on the time span between the discharge signal and the start of the preceding charge pulse.

18. The method according to claim 14, wherein the delay period has a predefined minimum value.

19. The method according to claim 14, wherein the discharge signal is a falling edge of a control signal.

* * * * *